(12) United States Patent
Wu et al.

(10) Patent No.: US 12,268,054 B2
(45) Date of Patent: Apr. 1, 2025

(54) DISPLAY PANEL AND ELECTRONIC DEVICE

(71) Applicant: Innolux Corporation, Miao-Li County (TW)

(72) Inventors: Yuan-Lin Wu, Miao-Li County (TW); Mei-Chi Hsu, Miao-Li County (TW); Meng-Kai Huang, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 318 days.

(21) Appl. No.: 17/751,676

(22) Filed: May 24, 2022

(65) Prior Publication Data
US 2022/0406863 A1    Dec. 22, 2022

(30) Foreign Application Priority Data
Jun. 21, 2021  (CN) .......................... 202110688069.8

(51) Int. Cl.
*H10K 59/121* (2023.01)
*H10K 59/40* (2023.01)
*H10K 71/00* (2023.01)

(52) U.S. Cl.
CPC ......... *H10K 59/1213* (2023.02); *H10K 59/40* (2023.02); *H10K 71/00* (2023.02)

(58) Field of Classification Search
CPC .... H10K 59/88; H10K 59/1213; H10K 59/40; H10K 71/00; H10K 59/65; H10K 59/8731
See application file for complete search history.

(56) References Cited

U.S. PATENT DOCUMENTS

| | | | |
|---|---|---|---|
| 2004/0056825 A1* | 3/2004 | Min | H05B 41/3927 345/38 |
| 2015/0171152 A1* | 6/2015 | Choi | H10K 10/462 438/157 |
| 2019/0288047 A1 | 9/2019 | Jeong et al. | |
| 2020/0006701 A1* | 1/2020 | Lee | H10K 59/121 |
| 2020/0067017 A1 | 2/2020 | Seo et al. | |

FOREIGN PATENT DOCUMENTS

CN            108649133            10/2018

* cited by examiner

*Primary Examiner* — Shaheda A Abdin
(74) *Attorney, Agent, or Firm* — JCIPRNET (57) ABSTRACT

An electronic device and a display panel are provided. The display panel includes a substrate, a light-emitting unit, a blocking structure and an encapsulation layer. The substrate has a through hole, a display area, and a non-display area disposed between the through hole and the display area. The light-emitting unit is arranged on the display area. The blocking structure is arranged on the non-display area. The encapsulation layer extends from the display area to the non-display area, and includes an organic layer and a first inorganic layer. A portion of the organic layer is disposed between the blocking structure and the first inorganic layer.

20 Claims, 8 Drawing Sheets

DISPLAY PANEL AND ELECTRONIC DEVICE

CROSS-REFERENCE TO RELATED APPLICATION

This application claims the priority benefit of China application serial no. 202110688069.8, filed on Jun. 21, 2021. The entirety of the above-mentioned patent application is hereby incorporated by reference herein and made a part of this specification.

BACKGROUND

Technical Field

The disclosure relates to a display panel and an electronic device.

Description of Related Art

In response to development and use requirements of electronic devices, display panels have been continuously developed towards a trend of high screen ratio. At the same time, in order to achieve functions such as sensing and sound transmission of the electronic device, a through hole structure is configured on the display panel. In order to achieve the high screen ratio, it is a design trend to arrange a through hole near a display area of the display panel. How to reduce the effect that the arrangement of the through hole affects a performance of the display units in the display area will be important.

SUMMARY

An embodiment of the disclosure provides a display panel including a substrate, a light-emitting unit, a blocking structure and an encapsulation layer. The substrate has a through hole, a display area, and a non-display area disposed between the through hole and the display area. The light-emitting unit is arranged on the display area. The blocking structure is arranged on the non-display area. The encapsulation layer extends from the display area to the non-display area, and includes an organic layer and a first inorganic layer. A portion of the organic layer is disposed between the blocking structure and the first inorganic layer.

An embodiment of the disclosure provides an electronic device including a display panel and a sensing element. The display panel includes a substrate, a light-emitting unit, a blocking structure and an encapsulation layer. The substrate has a through hole, a display area, and a non-display area disposed between the through hole and the display area. The light-emitting unit is arranged on the display area. The blocking structure is arranged on the non-display area. The encapsulation layer extends from the display area to the non-display area, and includes an organic layer and a first inorganic layer. A portion of the organic layer is disposed between the blocking structure and the first inorganic layer. The sensing element is disposed under the display panel and corresponds to the through hole.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Certain terms are used throughout the specification of the disclosure and the appended claims to refer to specific components. Those skilled in the art should understand that electronic device manufacturers may probably use different names to refer to the same components. This specification is not intended to distinguish between components that have the same function but different names. In the following specification and claims, the terms "containing", "including", etc., are open terms, so that they should be interpreted as meaning of "including but not limited to . . . ".

Directional terminology mentioned in the following embodiments, such as "top," "bottom," "left," "right," "front," "back," etc., is used with reference to the orientation of the FIG(s) being described and are not intended to limit the disclosure. In the FIGS., each of the drawings depicts typical features of methods, structures, and/or materials used in the particular exemplary embodiments. However, these drawings are not to be interpreted as limiting or limiting the scope or property covered by these exemplary embodiments. For example, for clarity's sake, relative size, thickness and position of each film layer, region and/or structure may be reduced or enlarged.

In the disclosure, when one structure (or layer, component, substrate) is described to be located on another structure (or layer, component, substrate), it means that the two structures are adjacent and directly connected (or contacted), or means that the two structures are adjacent but not directly connected (or contacted). Indirect connection means that there is at least one intermediate structure (or intermediate layer, intermediate component, intermediate substrate, intermediate space) between the two structures, and a lower surface of one structure is adjacent or directly connected to an upper surface of the intermediate structure, and an upper surface of the other structure is adjacent or directly connected (or contacted) to a lower surface of the intermediate structure, and the intermediate structure may be composed of a single layer or multi-layer solid structure or non-solid structure, which is not limited by the disclosure. In the disclosure, when a certain structure is disposed "on" another structure, it may mean that the certain structure is "directly" on the another structure, or that the certain structure is "indirectly" on the another structure, i.e., at least one structure is sandwiched between the certain structure and the another structure.

The terms "about", "equal to", "equivalent" or "same", "substantially" or "approximately" are generally interpreted as within 20% of a given value or range, or as within 10%, 5%, 3%, 2%, 1%, or 0.5% of a given value or range.

Ordinal numbers such as "first", "second", etc., used in the specification and claims are used to modify components, and they do not imply and represent that this (or these) components have any previous ordinal numbers, nor do they represent an order of one component over another, or an order of a manufacturing method, and the use of these ordinal numbers is only used to clearly distinguish a component with a certain name from another component with the same name. The claims and the specification may not use the same terms, whereby a first element in the specification may be a second element in the claim.

The electrical connection or coupling described in the disclosure may all refer to direct connection or indirect connection, where in the case of direct connection, terminals of components on two circuits are directly connected or connected to each other by a conductive line segment, and in the case of indirect connection, there are switches, diodes, capacitors, inductors, resistors, other suitable components, or a combination of the above-mentioned components between the terminals of the components on the two circuits, but the disclosure is not limited thereto.

In the disclosure, thicknesses, lengths and widths may be measured by using an optical microscope, and thicknesses or widths may be obtained by measuring a cross-sectional image by using an electron microscope, but the disclosure is not limited thereto. In addition, any two values or directions used for comparison may have certain errors. Moreover, the terms "equal to", "equivalent", "same", "substantially" or "approximately" generally mean within 10% of a given value or range. In addition, the phrases "a given range is from a first value to a second value", "a given range falls within a range from the first value to the second value" mean that the given range includes the first value, the second value and other values there between. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

It should be noted that, in the following embodiments, features in several different embodiments may be replaced, reorganized, and mixed to complete other embodiments without departing from the spirit of the disclosure. As long as the features of the various embodiments do not violate the spirit of the disclosure or conflict with each other, they are adapted to be mixed and matched arbitrarily.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
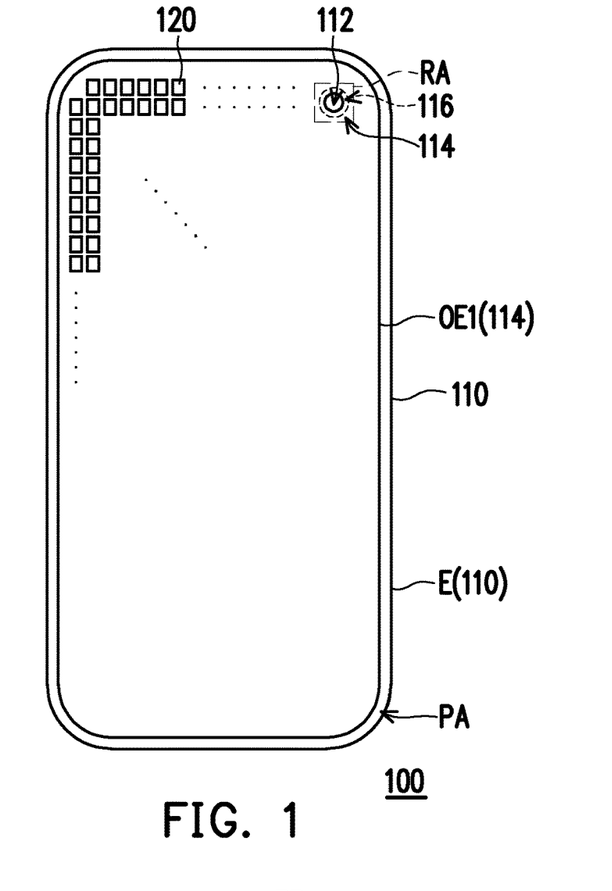
FIG. 1 is a schematic diagram of a display panel according to an embodiment of the disclosure.
Figure 2:
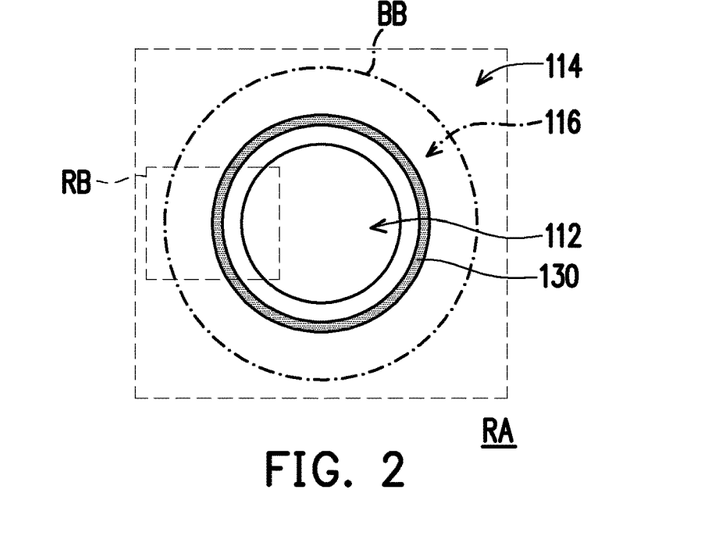
FIG. 2 is a schematic partially enlarged view of a region RA of the display panel of FIG. 1.

FIG. 1 is a schematic diagram of a display panel according to an embodiment of the disclosure. FIG. 2 is a schematic partially enlarged view of a region RA of the display panel of FIG. 1. In FIG. 1 and FIG. 2, a display panel 100 includes a substrate 110, and the substrate 110 may have a through hole 112, a display area 114, and a non-display area 116 between the through hole 112 and the display area 114. In some embodiments, the display panel 100 may include a plurality of light-emitting units 120, and the plurality of light-emitting units 120 are disposed in the display area 114. In some embodiments, the light-emitting units 120 may be, for example, disposed on the substrate 110, where the light-emitting unit 120 may be regarded as a sub pixel, the light-emitting units 120 emitting different colors may, for example, form a pixel, and the light-emitting units 120 located in different pixels and emitting a same color may be arranged along a direction X. In some embodiments, the light-emitting unit 120 may include a pixel circuit and a light-emitting layer, where the pixel circuit may include a transistor and a capacitor, and the pixel circuit may be used to control an operation of the light-emitting layer to achieve a display effect. Lamination of the light-emitting unit 120 may be described with reference to subsequent FIG. 6.

In some embodiments, the display area 114 may be defined as an area roughly enclosing the light-emitting layers of all of the light-emitting units 120, and a detailed example of a material of the light-emitting layer may be described with reference to FIG. 6. In some embodiments, there is a boundary BB between the display area 114 and the non-display area 116, and the non-display area 116 may be defined as an area between an edge of the through hole 112 and the boundary BB. In some embodiments, the display panel 100 may further have a peripheral area PA, and the peripheral area PA may be defined as an area between an outer edge OE1 of the display area 114 and an edge E of the substrate 110. In some embodiments, the peripheral area PA may be provided with circuit structures, but the disclosure is not limited thereto. In some embodiments (not shown), the display panel 100 may not have the peripheral area PA. In some embodiments (not shown), at least a part of the outer edge OE1 of the display area 114 is, for example, substantially aligned with the edge E of the substrate 110. In some embodiments, the display area 114 may, for example, surround the non-display area 116, and the non-display area 116 may surround the through hole 112.

As shown in FIG. 2, the display panel 100 may include a blocking structure 130, and the blocking structure 130 may be disposed on the non-display area 116. In some embodiments, the blocking structure 130 may, for example, surround the through hole 112 in a top view. In some embodiments, in the top view, the blocking structure 130 may have, for example, a ring-shaped pattern, but the disclosure is not limited thereto. Although a shape of the through hole 112 in FIG. 2 is illustrated as a circle, and a shape of the blocking structure 130 is illustrated as an annular circle, the disclosure is not limited thereto. In some embodiments, the shape of the through hole 112 may include an oval, a rectangle, a polygon, or other shapes. In some embodiments, the shape of the blocking structure 130 may include a rectangular ring, a polygonal ring, or a ring of other shapes. In some embodiments, the number of the blocking structure 130 may be one, but the disclosure is not limited thereto. In some embodiments (not shown), when the number of the blocking structures 130 is plural, the related description of the blocking structures 130 described in the disclosure may be, for example, at least applied to the blocking structure closest to the through hole 112.

Figure 3:
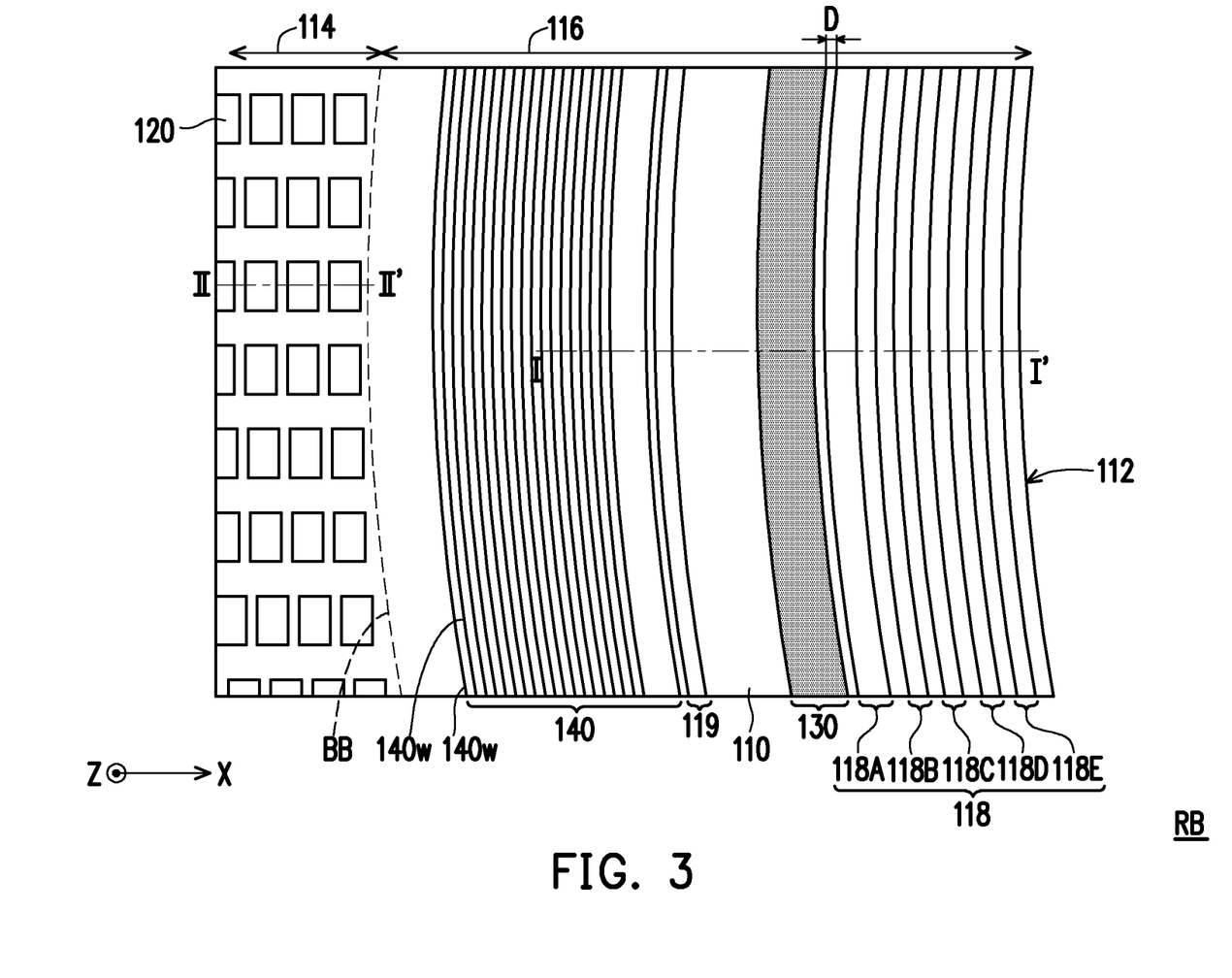
FIG. 3 is a schematic partial enlarged view of a region RB of FIG. 2.
Figure 4:
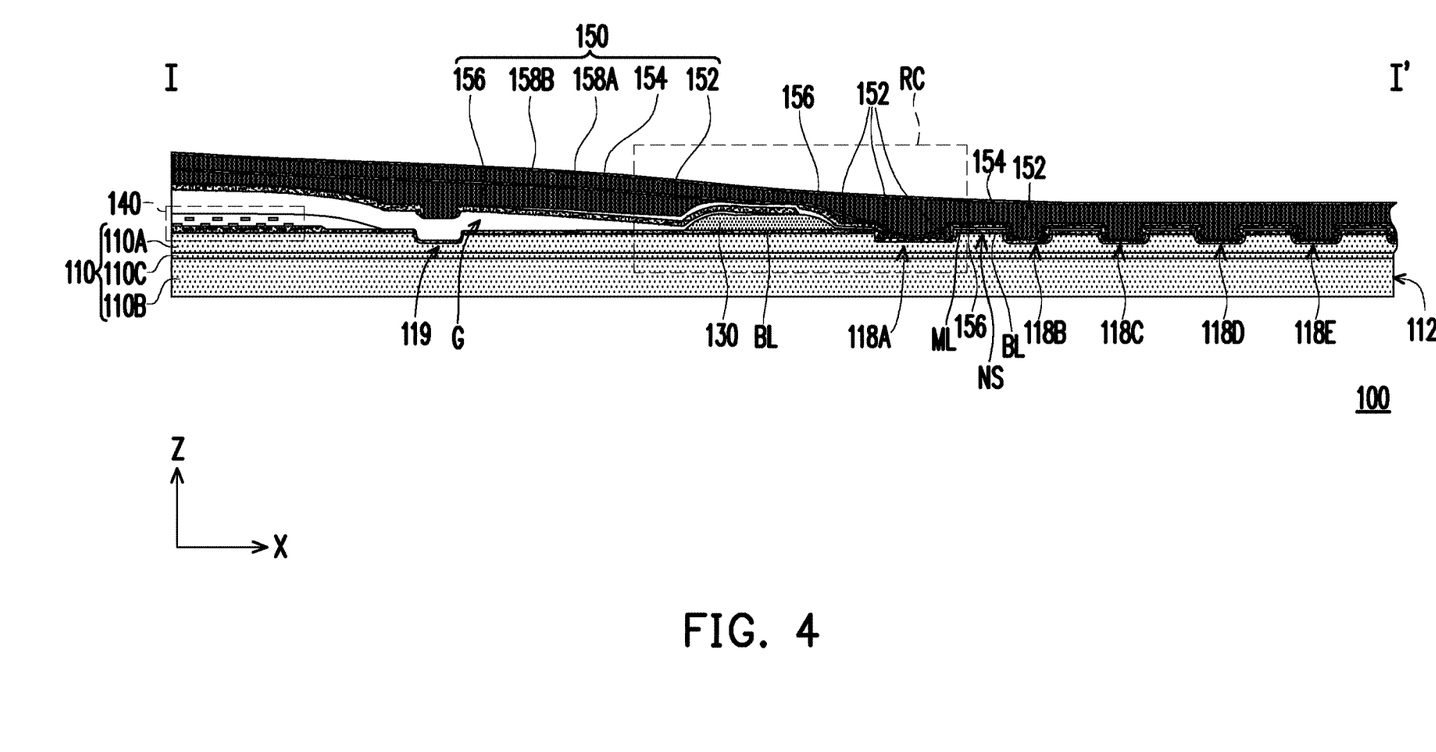
FIG. 4 is a schematic cross-sectional view of the structure of FIG. 3 along a section line I-I'.
Figure 5:
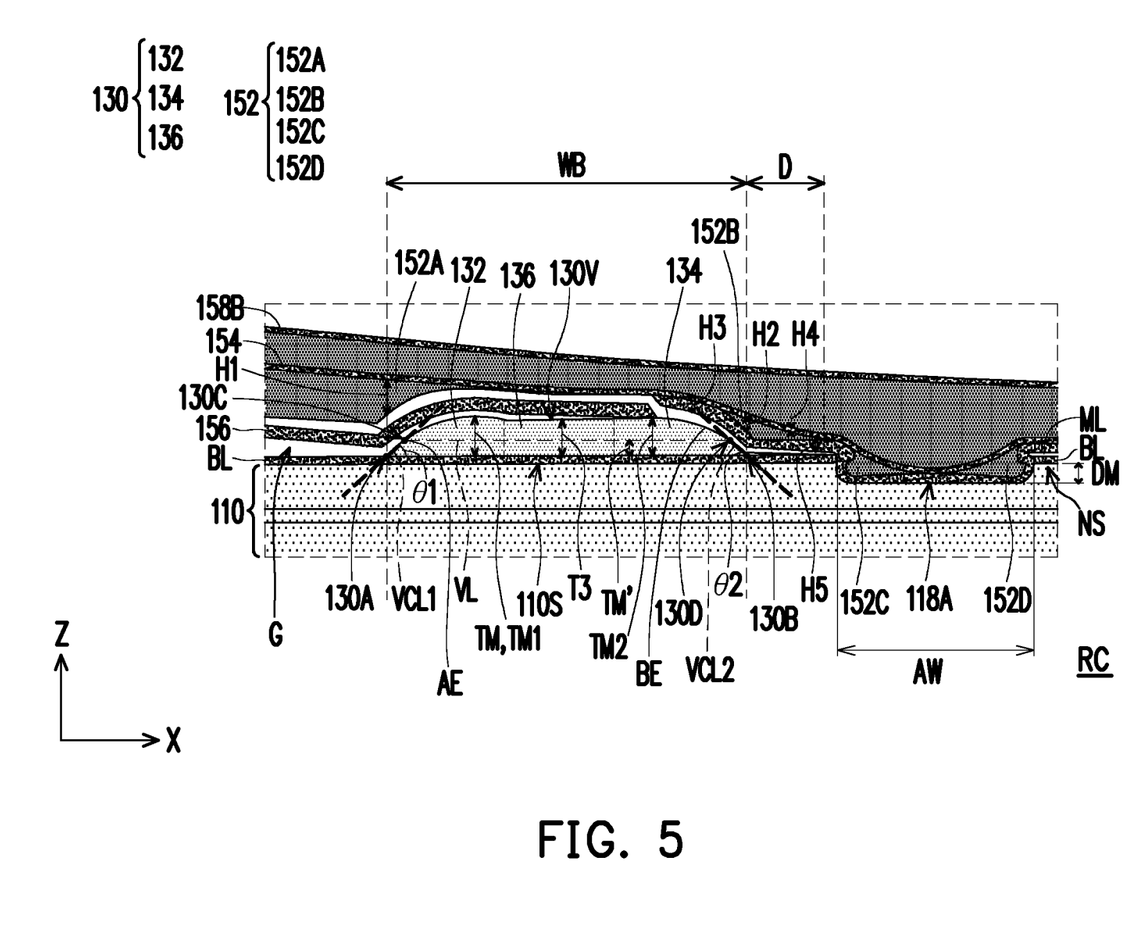
FIG. 5 is a schematic partial enlarged view of a region RC of FIG. 4.

FIG. 3 is a schematic partial enlarged view of a region RB of FIG. 2, FIG. 4 is a schematic cross-sectional view of the structure of FIG. 3 along a section line I-I', and FIG. 5 is a schematic partial enlarged view of a region RC of FIG. 4. According to FIG. 3, FIG. 4 and FIG. 5, it is known that the substrate 110 of the display panel 100 may have a plurality of slits 118, and the slits 118 are disposed between the through hole 112 and the blocking structure 130. In FIG. 3 and FIG. 4, five slits 118 (for example, a slit 118A, a slit 118B, a slit 118C, a slit 118D, and a slit 118E) are taken as an example for description, and these slits 118 (for example, the slit 118A, the slit 118B, the slit 118C, the slit 118D, and the slit 118E) may respectively surround the through hole 114 and be arranged between the blocking structure 130 and the through hole 114, but the disclosure is not limited thereto. In some embodiments, in the direction X, the blocking structure 130 and the slit (such as the slit 118A) closest to the blocking structure 130 may be, for example, separated by a distance D, i.e., in the direction X, the blocking structure 130 and the closest slit (such as the slit 118A) are separated from each other by the distance D, but the disclosure is not limited thereto. In some embodiments, the plurality of slits 118 (for example, the slits 118A, 118B, 118C, 118D, and 118E) may have the same or different widths. In some embodiments, at least two slits 118 (for example, the slits 118A, 118B, 118C, 118D, and 118E) have different widths. The widths of these slits may be defined as widths in the direction X, and the widths of these slits are, for example, widths obtained by measuring bottoms of the slits, such as a width AW of the slit 118A shown in FIG. 5, and measurement of the widths of the other slits 118 may be deduced by analogy. In some embodiments, the width AW of the slit 118A closest to the blocking structure 130 may be, for example, greater than or equal to the widths of other slits (for example, the slit 118B to the slit 118E), but the disclosure is not limited thereto. In some embodiments (not shown), the widths of the plurality of slits may have a design that the farther away the slit is from the blocking structure 130, the smaller the width is according to an arrangement position thereof, but the disclosure is not limited thereto, and the above-mentioned design of " . . . the smaller the width is" is not limited to equal scaling down. In some embodiments, the display panel 100 may include a conductive structure 140 disposed in the non-display area 116, the conductive structure 140 may include a plurality of conductor lines 140w, and the conductor lines 140w may be used to transmit signals to the light-emitting units 120, but the disclosure is not limited thereto. In some embodiments, the substrate 110 may, for example, have a slit 119 between the conductive structure 140 and the blocking structure 130, but the disclosure is not limited thereto. In some embodiments, the slit 119 may be, for example, disposed between the display area 114 and the blocking structure 130.

According to FIG. 4, the display panel 100 may include an encapsulation layer 150. In some embodiments, the encapsulation layer 150 may, for example, extend from the display area 114 (refer to FIG. 3) to the non-display area 116, and includes at least an organic layer 152 and a first inorganic layer 154, but the disclosure is not limited thereto. In FIG. 4, a part of the organic layer 152 may be, for example, disposed between the blocking structure 130 and the first inorganic layer 154. In some embodiments, a projection of the organic layer 152 on the substrate 110 may be partially overlapped with a projection of the blocking structure 130 on the substrate 110 in a normal direction Z of the substrate 110. In some embodiments, the encapsulation layer 150 may include a second inorganic layer 156, where the second inorganic layer 156 may be disposed under the organic layer 152, and the first inorganic layer 154 contacts the second inorganic layer 156 on the blocking structure 130. In some embodiments, the encapsulation layer 150 may be, for example, a multi-layer film layer formed by alternately stacking multi-layer organic layers and multi-layer inorganic layers. For example, in some embodiments, the encapsulation layer 150 may be, for example, a multi-layer lamination composed of the second inorganic layer 156, the organic layer 152, the first inorganic layer 154, an organic layer 158A and/or an inorganic layer 158B, etc., that are stacked in sequence, but the disclosure is not limited thereto. One or more layer between the layers of the encapsulation layer 150 may be selectively deleted or one or more other layer may be selectively inserted between the layers of the encapsulation layer 150. In some embodiments, at least a part of the layers in the encapsulation layer 150 (for example, the second inorganic layer 156, the first inorganic layer 154, the organic layer 158A, and/or the inorganic layer 158B, but the disclosure is not limited thereto) may, for example, extend from the display area 114 (referring to FIG. 3) to the edge of the through hole 112 of the non-display area 116, but the disclosure is not limited thereto. In some embodiments, at least a part of the layers in the encapsulation layer 150 (for example, the organic layer 152) may extend from the display area 114 (referring to FIG. 3) to a part of the non-display area 116, but does not extend to the edge of the through hole 112, so that moisture intruded from the through hole 112 cannot directly intrude into the organic layer 152. In detail, the moisture intruded from the through hole 112 may, for example, first intrude into the above-mentioned part of layers (for example, the second inorganic layer 156, the first inorganic layer 154, the organic layer 158A and/or the inorganic layer 158B) of the encapsulation layer 150 extending to the edge of the through hole 112, and since the inorganic layer in the encapsulation layer 150 has a better moisture blocking property, it is difficult for the moisture to intrude into the organic layer 152 through the inorganic layer. Moreover, as described above, the encapsulation layer 150 may be disposed on the light-emitting units 120, and the organic layer 152 is, for example, the organic layer that is closer to the light-emitting units 120 in all of the layers of the encapsulation layer 150. Therefore, the above-mentioned design may reduce the direct intrusion of moisture into the organic layer 152 to affect a performance of the light-emitting units 120. In some embodiments, the materials of the inorganic layers (for example, the first inorganic layer 154, the second inorganic layer 156, and/or the inorganic layer 158B) in the encapsulation layer 150 may include silicon oxide (SiOx), silicon nitride (SiNx), silicon oxynitride, similar materials, or a combination of the above materials, but the disclosure is not limited thereto. In some embodiments, a material of the organic layer (for example, the organic layer 152 and/or the organic layer 158A) in the encapsulation layer 150 may include polyimide, epoxy resin, other organic compounds, or a combination thereof, but the disclosure is not limited thereto. In some embodiments, a material of the blocking structure 130 may include photoresist, polyimide, epoxy, other organic compounds, or a combination thereof, but the disclosure is not limited thereto. In some embodiments, the blocking structure 130 may be formed by stacking a single layer or multiple layers of organic layers, but the disclosure is not limited thereto.

In FIG. 4, the substrate 110 may include a first substrate 110A, a second substrate 110B and/or a connecting member 110C (for example, an adhesive layer), and the connecting member 110C may be used to attach the first substrate 110A and the second substrate 110B with each other. In some embodiments, the first substrate 110A and the second substrate 110B may respectively include a plastic substrate, and a material thereof includes a polymer (for example, polyimide (PI), polyethylene terephthalate (PET)) and/or other suitable materials, or a combination thereof, but the disclosure is not limited thereto. In some embodiments, the substrate 110 may be selectively attached to a support plate (not shown), the support plate may provide support strength, and the support plate includes, for example, glass, quartz, stainless steel, copper, graphite sheet, ceramic or other suitable materials, or a combination of the above materials. For example, the substrate 110 may be a composite stack, such as, but not limited to, a stack of polyimide-inorganic layer (for example, silicon oxynitride)-polyimide, but the disclosure is not limited thereto.

As shown in FIG. 4 and FIG. 5, it is known that in some embodiments, a buffer layer BL may be disposed on the substrate 110, and the buffer layer BL may be, for example, disposed between the substrate 110 and the encapsulation layer 150. In some embodiments, the buffer layer BL may be, for example, disposed between the substrate 110 and the light-emitting units 120. In some embodiments, during the manufacturing process of the display panel 100, for example, after some layers (for example, the buffer layer BL, the layers of the pixel circuit, the light-emitting units 120 and/or the blocking structure 130) are disposed on the substrate 110, and before the encapsulation layer 150 is configured, a removal step of removing a part of the non-display area 116 of the substrate 110 may be performed, and the above-mentioned plurality of slits 118 may be formed through the removal step. Therefore, these slits 118 may not contain, for example, the layers formed on the substrate 110 prior to the removal step. The above-mentioned "removal step" is, for example, to remove a part of the substrate by laser, but the disclosure is not limited thereto.

In some embodiments, a non-slit area NS may be formed between adjacent slits 118. In some embodiments, the buffer layer BL and/or a composite layer ML still exist on the substrate 110 corresponding to the non-slit region NS, and the composite layer ML may include a light-emitting layer, and the light-emitting layer in the composite layer ML may be, for example, the same layer as a light-emitting layer 124 (referring to FIG. 6) of the light-emitting units 120, but the light-emitting layer in the composite layer ML is not electrically connected to a pixel electrode, but the disclosure is not limited thereto. After the removal step is performed on the substrate 110 as described above, the encapsulation layer 150 may be subsequently disposed. The encapsulation layer 150, for example, extends from the display area 114 to the non-display area 116 of the substrate 110. In some embodiments, the layers corresponding to the non-slit area NS of the substrate 110 may be, for example, sequentially arranged from bottom to top as the buffer layer BL, the composite layer ML and at least a part of the encapsulation layer 150, and the at least a part of the encapsulation layer 150 includes, for example, the second inorganic layer 156, the first inorganic layer 154, the organic layer 158A and/or the inorganic layer 158B in the encapsulation layer 150, but the disclosure is not limited thereto. In some embodiments, the second inorganic layer 156 and the first inorganic layer 154 corresponding to the non-slit area NS of the substrate 110 may be, for example, in contact with each other, thereby reducing a chance that the moisture intruded from the through hole 112 directly intrudes into the organic layer 152 to affect the light-emitting units 120.

It should be noted that the schematic partial cross-sectional view shown in FIG. 4 or FIG. 5 may be, for example, an embodiment after the display panel 100 is split, so that a gap G is probably formed between the encapsulation layer 150 and the above stacked layers formed on the substrate 110 (for example, the buffer layer BL, the blocking structure 130 and/or the composite layer ML) due to the split. Actually, when the encapsulation layer 150 is formed, the gap G generated due to the split, for example, does not exist between the encapsulation layer 150 and other stacked layers formed on the substrate 110 (for example, the buffer layer BL, the blocking structure 130 and/or the composite layer ML).

Referring to FIG. 4 and FIG. 5, in the cross section of the display panel 100, the blocking structure 130 has a first end 130A and a second end 130B opposite to the first end 130A. The first end 130A of the blocking structure 130 may be defined as an end of a bottom surface of the blocking structure 130 that is closer to the display area 114 (referring to FIG. 3), and the second end 130B of the blocking structure 130 may be defined as an end of the bottom surface of the blocking structure 130 that is closer to the through hole 112 (referring to FIG. 3 and FIG. 4). The blocking structure 130 may have a first inclined edge AE and a second inclined edge BE respectively corresponding to the first end 130A and the second end 130B, and the first inclined edge AE and the second inclined edge BE respectively include different angles $\theta 1$ and $\theta 2$ with respect to a surface 1105 of the substrate 110. In detail, the angle $\theta 1$ and the angle $\theta 2$ may be defined as follows: first, a virtual line VL parallel to the surface 1105 of the substrate 110 is drawn at a ⅓ thickness TM' of the maximum thickness TM of the blocking structure 130. The virtual line VL may be intersected with the first inclined edge AE at an intersection point 130C, and the virtual line VL may be intersected with the second inclined edge BE at an intersection point 130D, an end point of the first end 130A and the intersection point 130C may be connected to form a virtual connection line VCL1, and an end point of the second end 130B and the intersection point 130D may be connected to form a virtual connection line VCL2. An included angle between the virtual connection line VCL1 and the surface 1105 of the substrate 110 may be defined as the angle $\theta 1$. Similarly, an included angle between the virtual connection line VCL2 and the surface 1105 of the substrate 110 may be defined as the angle $\theta 2$. In some embodiments, the angle $\theta 1$ is closer to the display area 114 (referring to FIG. 3) than the angle $\theta 2$, and the value of the angle $\theta 1$ may be different to or the same as the angle $\theta 2$. In some embodiments, a difference between the angle $\theta 1$ and the angle $\theta 2$ may be greater than 0 degree and less than or equal to 20 degrees (0 degree<the difference≤20 degrees), or greater than or equal to 3 degrees and less than or equal to 15 degrees (3 degrees≤the difference≤15 degrees), but the disclosure is not limited thereto. In some embodiments, the angle $\theta 1$ may be less than or equal to the angle $\theta 2$, or the angle $\theta 1$ may be greater than or equal to the angle $\theta 2$.

According to FIG. 5, in the cross section of the display panel 100, the maximum width WB of the blocking structure 130 may be a distance between the first end 130A and the second end 130B of the blocking structure 130. In addition, the blocking structure 130 (for example, the second end 130B) and the slit 118A may be separated by a distance D in a direction (for example, the direction X) perpendicular to the normal direction Z of the substrate 110. In some embodiments, the distance D may be, for example, greater than the maximum thickness TM of the blocking structure 130 in the cross section of the display panel 100. In some embodiments, a ratio of the distance D to the maximum thickness TM of the blocking structure 130 may be greater than 1 and less than or equal to 3 ($1<D/TM\leq3$), or greater than or equal to 1.5 and less than or equal to 2.5 ($1.5\leq D/TM\leq2.5$), but the disclosure is not limited thereto. For example, the ratio of the distance D to the maximum thickness TM of the blocking structure 130 may be 1.7 or 1.9, but the disclosure is not limited thereto. In the cross section of the display panel 100, a ratio of the maximum thickness TM of the blocking structure 130 to the maximum depth DM of the slit 118A is greater than 1 and less than or equal to 3 ($1<TM/DM\leq3$), or greater than or equal to 1.5 and less than or equal to 2.5 ($1.5\leq M/DM\leq2.5$), but the disclosure is not limited thereto. For example, the ratio of the maximum thickness TM of the blocking structure 130 to the maximum depth DM of the slit closest to the blocking structure 130 (for example, the slit 118A) may be 1.6 or 1.4, but the disclosure is not limited thereto. It should be noted that the maximum thickness TM of the blocking structure 130 in FIG. 5 is located at the first inclined edge AE, but the disclosure is not limited thereto. In other embodiments (not shown), the maximum thickness TM of the blocking structure 130 may be located at the second inclined edge BE, but the disclosure is not limited thereto.

In FIG. 5, the blocking structure 130 has the maximum width WB and the maximum thickness TM in the cross section of the display panel 100, and a ratio of the maximum width WB to the maximum thickness TM may be greater than or equal to 2.5 and less than or equal to 15 ($2.5\leq WB/TM\leq15$), or greater than or equal to 4 and less than or equal to 12 ($4\leq WB/TM\leq12$), but the disclosure is not limited thereto. In some embodiments, the blocking structure 130 may be roughly divided into three portions according to the maximum width WB, i.e., respective widths of the three portions are, for example, ⅓ times of the maximum width WB. For example, the blocking structure 130 may have a first portion 132, a second portion 134, and a third portion 136 between the first portion 132 and the second portion 134. In the cross section of the display panel 100, the maximum thickness TM1 of the first portion 132 may be different from the maximum thickness TM2 of the second portion 134. In some embodiments, the maximum thickness T3 of the third portion 136 may be less than at least one of the maximum thickness TM1 and the maximum thickness TM2. In some embodiments, a top surface of the blocking structure 130 has a recess 130V.

In some embodiments, the blocking structure 130 may have an asymmetric structure. In some embodiments, in the process of forming the organic layer 152 on the substrate 110, when the blocking structure 130 is designed to have the asymmetric structure, the material of the organic layer 152 may flow toward the side with a relatively low topography. In some embodiments, the organic layer 152 has a first thickness H1 at the first end 130A of the blocking structure 130 and a second thickness H2 at the second end 130B of the blocking structure 130. In some embodiments, the first end 130A (or the first portion 132) is, for example, closer to the display area 114 (referring to FIG. 3) than the second end 130B (or the second portion 134), and the first thickness H1 may be greater than the second thickness H2, but the disclosure is not limited thereto. Through such design, the material of the organic layer 152 may flow toward the side with the relatively low topography (for example, the second portion 134). According to FIG. 5, in the cross section of the display panel 100, a part of the organic layer 152 may be disposed between the blocking structure 130 and the first inorganic layer 154, and the part of the organic layer 152 has two separated portions (for example, a portion 152A and a portion 152B). In detail, the organic layer 152 may be divided into a portion 152A close to the first end 130A of the blocking structure 130 and another portion 152B close to the second end 130B of the blocking structure 130. In some embodiments, the portion 152A and the portion 152B disposed between the blocking structure 130 and the first inorganic layer 154 may be separated from each other. The aforementioned separation of the portion 152A and the portion 152B enables the first inorganic layer 154 to contact the second inorganic layer 156 on the blocking structure 130. When moisture intrudes into the organic layer 152 accidently, through the above design of separating the organic layer 152 into two portions, a transmission path of the moisture in the organic layer 152 may be cut off, so as to reduce a chance that the moisture intrudes into the light-emitting units 120 through the organic layer 152, and accordingly improve the quality of the light-emitting units 120.

In addition, as shown in FIG. 5, other portions (including a portion 152C and/or a portion 152D) of the organic layer 152 may be, for example, located in the slit 118A. In some embodiments, the organic layer 152 located in the slit 118A may be, for example, divided into the portion 152C and the portion 152D, and the portion 152C and the portion 152D may be separated from each other, such as separated from each other on both sides in the slit 118A, so that the first inorganic layer 154 and the second inorganic layer 156 may be, for example, in contact with each other in the slit 118A. In some embodiments, the first inorganic layer 154 and the second inorganic layer 156 may have the same or different materials. It should be noted that when the materials of the first inorganic layer 154 and the second inorganic layer 156 are similar, an interface between the first inorganic layer 154 and the second inorganic layer 156 is not easily distinguished, and whether the first inorganic layer 154 and the second inorganic layer 156 are in contact may be determined by, for example, a thickness of the whole inorganic material. For example, the whole inorganic material at the contact of the first inorganic layer 154 with the second inorganic layer 156 has, for example, a thickness H3, the first inorganic layer 154 at the portion 152B has, for example, a thickness H4, and the second inorganic layer 156 at the portion 152B has, for example, a thickness H5, a relationship of the three thicknesses is, for example: $0.95(H4+H5)\leq H3\leq1.05(H4+H5)$.

In some embodiments, the organic layer 152 extending from the display area 114 towards a direction away from the display area 114 may form a relatively flat surface, and the relatively flat surface of the organic layer 152 may make the structure of the first inorganic layer 154 formed on the organic layer 152 more dense or less likely to break, which may reduce the chance that the moisture intrudes into the organic layer 152 through, for example, the first inorganic layer 154. Moreover, a relatively smooth slope structure formed by the portions 152B-152D of the organic layer 152 may also make the first inorganic layer 154 formed on such portions of the organic layer 152 more dense or less likely to break, which may also reduce the chance that the moisture intrudes into the organic layer 152 through the first inorganic layer 154.

Figure 6:
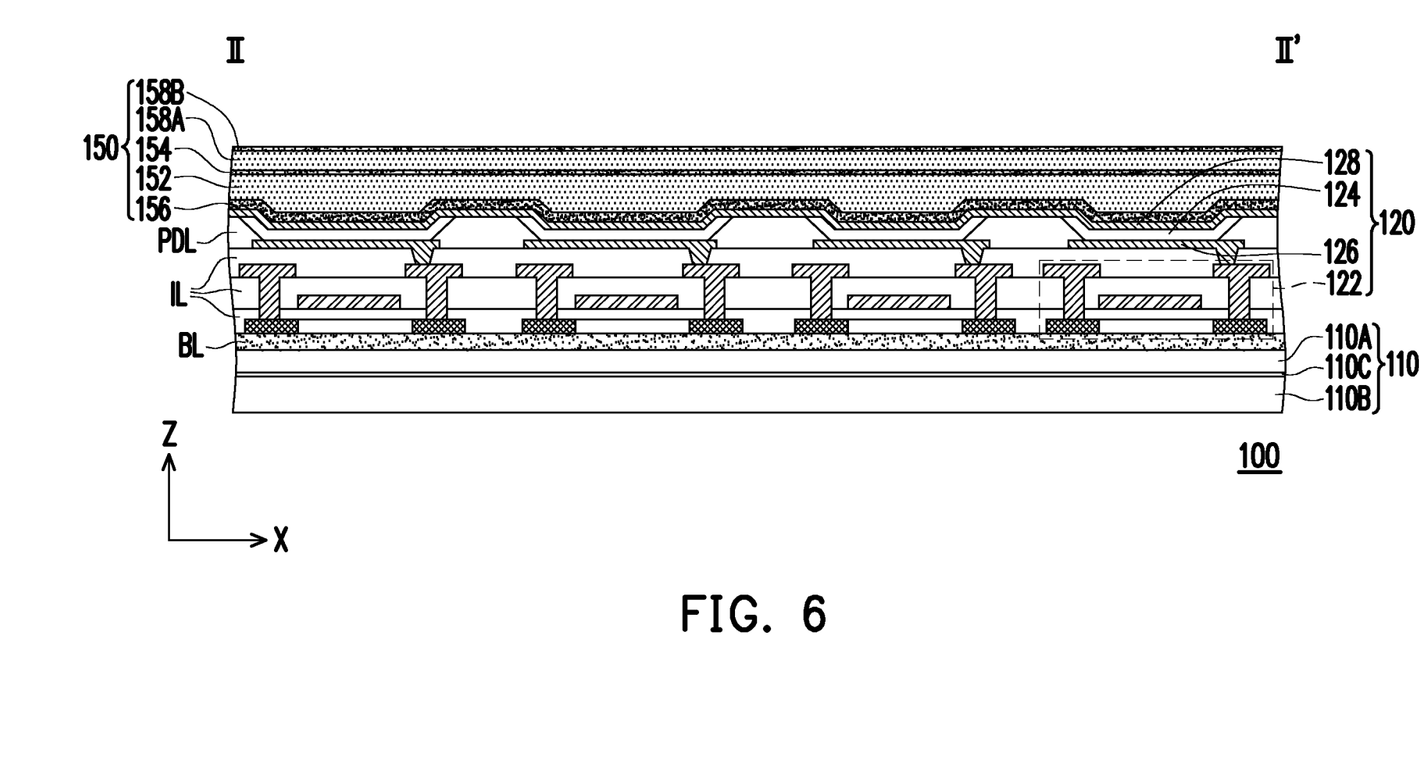
FIG. 6 is a schematic cross-sectional view of the structure of FIG. 3 along a section line II-II'.

FIG. 6 is a schematic cross-sectional view of the structure of FIG. 3 along a section line II-II'. FIG. 6 shows a cross-sectional structure of the display panel 100 in the display area 114. In the display area 114, the display panel 100 may include the substrate 110, the light-emitting units 120 disposed on the substrate 110, and the encapsulation layer 150, where the encapsulation layer 150 may, for example, extend from the display area 114 shown in FIG. 6 to the non-display area 116 shown in FIG. 4, and a part of the layers in the encapsulation layer 150 may, for example, selectively extend to the edge of the through hole 112 (referring to FIG. 4). In some embodiments, the light-emitting unit 120 may include, for example, a pixel circuit 122, a light-emitting layer 124, a first electrode 126 and a second electrode 128, but the disclosure is not limited thereto. In some embodiments, the light-emitting layer 124 may include an organic light-emitting material layer (OLED) or an inorganic light-emitting material, but the disclosure is not limited thereto. In some embodiments, the light-emitting layer 124 may include a hole injection layer, a hole transport layer, a light-emitting material layer, an electron transport layer, an electron injection layer, etc., but the disclosure is not limited thereto. In some embodiments, the pixel circuit 122 may include at least one transistor, and the transistor may include, for example, a semiconductor layer and three electrode terminals (for example, a gate terminal, a source terminal, and a drain terminal). In some embodiments, the light-emitting layer 124 may be disposed between the first electrode 126 and the second electrode 128 to form a diode structure, but the disclosure is not limited thereto. The first electrode 126 may be, for example, electrically connected to the pixel circuit 122, and the second electrode 128 may be shared by a plurality of light-emitting units 120. In some embodiments, the first electrode 126 may be, for example, a pixel electrode, and the second electrode 128 may be, for example, a common electrode. In addition, according to FIG. 6, the display panel 100 may include the aforementioned buffer layer BL, and the buffer layer BL may include, for example, a multi-layer stack (for example, $SiO_x$—$SiN_x$—$SiO_x$). In some embodiments, the display panel 100 may include a plurality of insulating layers IL, and the plurality of insulating layers IL may be used to isolate conductive layers or semiconductor layers of different layers. In some embodiments, the pixel circuit 122 may, for example, include a part of the multi-layer insulating layers IL. The display panel 100 may further include a pixel definition layer PDL, and the pixel definition layer PDL may separate the light-emitting layers 124 of different light-emitting units 120 to ensure a light-emitting effect of the individual light emitting unit 120. In some embodiments, the layer of the pixel definition layer PDL may be selectively a same layer or a different layer as the aforementioned blocking structure 130 disposed on the non-display area 116. In some embodiments, as described above, the substrate 110 may include the first substrate 110A, the second substrate 110B and/or the connecting member 110C, but the disclosure is not limited thereto.

Figure 7:
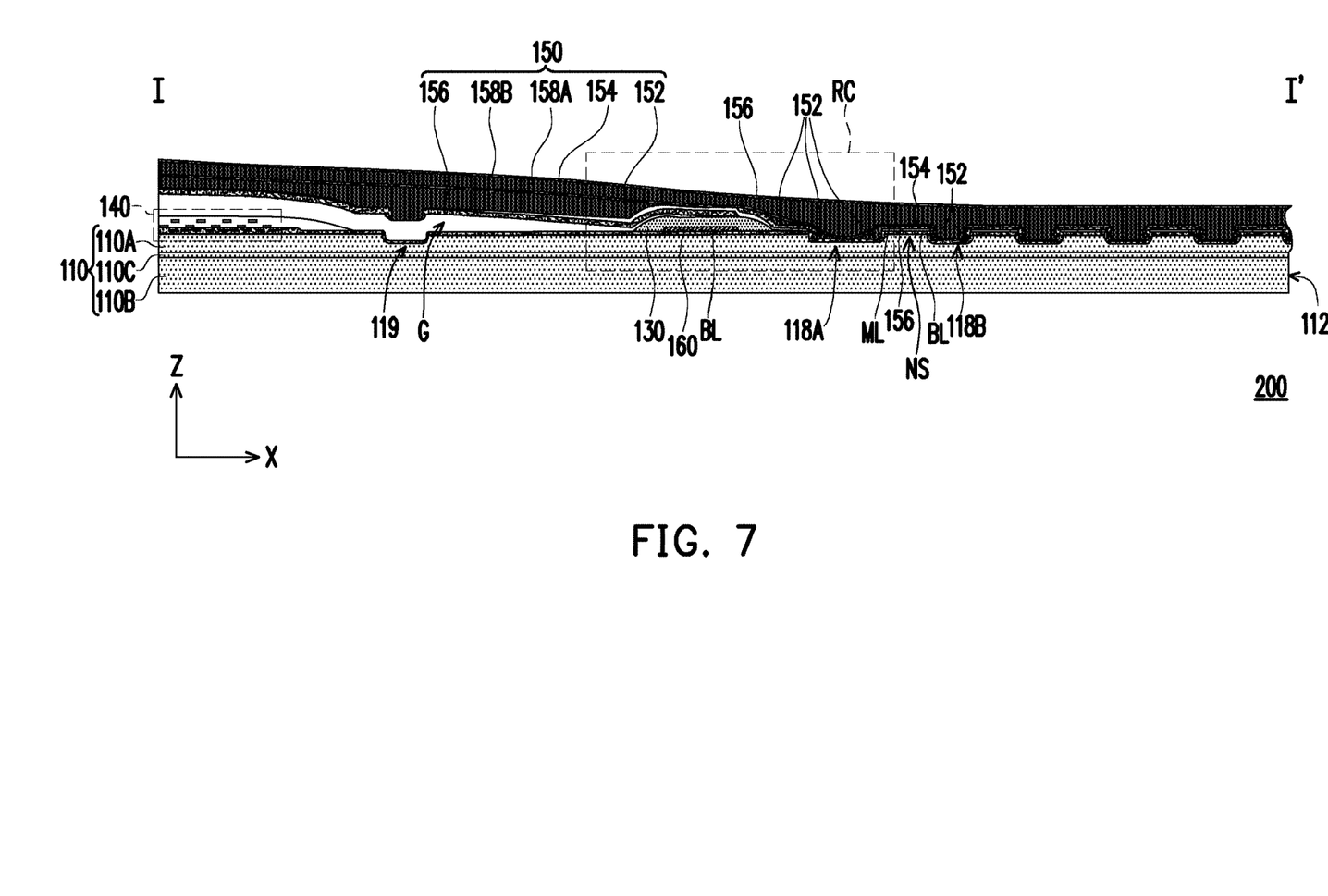
FIG. 7 is a schematic partial cross-sectional view of a display panel according to an embodiment of the disclosure.

FIG. 7 is a schematic partial cross-sectional view of a display panel according to an embodiment of the disclosure. The cross-sectional structure in FIG. 7 may be regarded as another implementation of the cross-sectional structure of FIG. 3 at the section line I-I'. A display panel 200 includes the substrate 110, the blocking structure 130 and the encapsulation layer 150. The substrate 110 may have the through hole 112, the display area (not shown), and the non-display area 116. FIG. 7 only illustrates the non-display area 116 of the display panel 200, so that the light-emitting units and the display area are not described here, and the description of the display area may refer to the aforementioned descriptions. The display panel 200 is substantially similar to the aforementioned display panel 100, so that the structure and arrangement relationship of the substrate 110, the blocking structure 130 and the encapsulation layer 150 may refer to the aforementioned content, which will not be repeated. A difference between the display panel 200 and the display panel 100 is mainly that a conductive pattern 160 is further disposed on the substrate 110, and the conductive pattern 160 may be, for example, disposed between the blocking structure 130 and the substrate 110. In some embodiments, the conductive pattern 160 may be the same layer as one of the conductive layers in the light-emitting unit 120, but the disclosure is not limited thereto. In some embodiments, the conductive pattern 160 may be electrically floating, or may be electrically connected to other circuit structures (not shown) in the display panel 200.

It should be noted that the schematic partial cross-sectional view shown in FIG. 7 may be, for example, an embodiment after the display panel 200 is split, so that a gap G is probably formed between the encapsulation layer 150 and the above stacked layers formed on the substrate 110 (for example, the buffer layer BL, the blocking structure 130 and/or the composite layer ML) due to the split. Actually, when the encapsulation layer 150 is formed, the gap G generated due to the split, for example, does not exist between the encapsulation layer 150 and other stacked layers formed on the substrate 110 (for example, the buffer layer BL, the blocking structure 130 and/or the composite layer ML).

Figure 8:
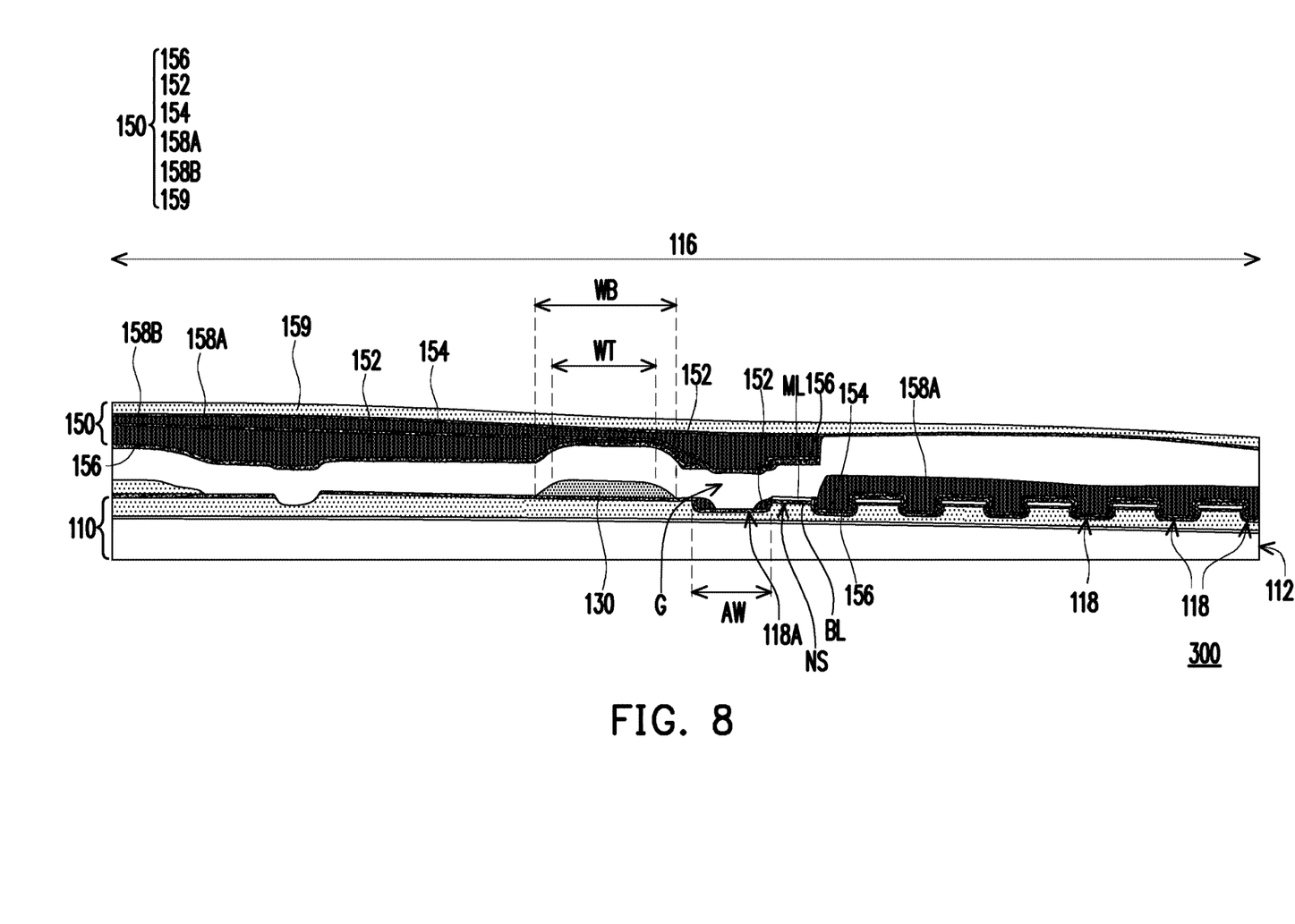
FIG. 8 is a schematic partial cross-sectional view of a display panel according to an embodiment of the disclosure.

FIG. 8 is a schematic partial cross-sectional view of a display panel according to an embodiment of the disclosure. The cross-sectional structure of FIG. 8 may be regarded as another implementation of the cross-sectional structure of FIG. 3 at the section line I-I'. A display panel 300 includes the substrate 110, the blocking structure 130 and the encapsulation layer 150. The substrate 110 has the through hole 112, the display area (not shown) and the non-display area 116, but FIG. 8 only illustrates the non-display area 116, so that the display area is not described here, and the description of the display area may refer to the aforementioned descriptions. The blocking structure 130 of the display panel 300 is, for example, disposed on the non-display area 116, the encapsulation layer 150 may, for example, extend from the display area (not shown) to the non-display area 116, and the encapsulation layer 150 may include the organic layer 152 and the first inorganic layer 154. As shown in FIG. 8, a part of the organic layer 152 may be disposed between the blocking structure 130 and the first inorganic layer 154.

In some embodiments, the display panel 300 is substantially similar to the aforementioned display panel 100, so that the structure and arrangement relationship of the substrate 110, the blocking structure 130 and the encapsulation layer 150 may refer to the aforementioned content, which will not be repeated. A difference between the display panel 300 and the display panel 100 is mainly that the substrate 110 of the display panel 300 may have a plurality of slits 118, and the edge of the through hole 112 cuts into the slit 118 closest to the through hole 112, i.e., a part of the encapsulation layer 150 disposed in the slit 118 is, for example, exposed by the through hole 112. In some embodiments, a width (not shown) of the slit 118 cut by the edge of the through hole 112 is, for example, smaller than a width (not shown) of the adjacent slit 118, but the disclosure is not limited thereto. In addition, the numbers of the slits 118 provided in the display panel 300 and the display panel 100 are also different.

In some embodiments, in the cross-sectional structure of FIG. 8, the maximum width WB of the blocking structure 130 may correspond to the bottom surface of the blocking structure 130, but the disclosure is not limited thereto. In some embodiments, the top surface of the blocking structure 130 may have a recess, but the disclosure is not limited thereto. The bottom surface of the blocking structure 130 is the surface facing the substrate 110, and the top surface of the blocking structure 130 is the surface away from the substrate 110. In some embodiments, a profile of the cross section of the blocking structure 130 may have an arc edge. In some embodiments, a ratio of the maximum width WB to a top surface width WT of the blocking structure 130 may be, for example, about 8 to 10 (8≤the ratio≤10) or 8.5 to 9.5 (8.5≤the ratio≤9.5), such as 9.12, 8.63, but the disclosure is not limited thereto. A ratio of the maximum width WB of the blocking structure 130 to the maximum width AW of the slit 118A close to the blocking structure 130 may be about 1.8 to 2.4 (1.8≤the ratio≤2.4) or 1.9 to 2.3 (1.9≤the ratio≤2.3), such as 1.92, 2.1, but the disclosure is not limited thereto. In some embodiments, the maximum width AW of the slit 118A may be 17 to 23 μm (17 μm≤the maximum width AW≤23 μm) or 18 μm to 21 μm (18 μm≤the maximum width AW≤21 μm), but the disclosure is not limited thereto.

It should be noted that the schematic partial cross-sectional view shown in FIG. 8 may be, for example, an embodiment after the display panel 300 is split, so that a gap G is probably formed between the encapsulation layer 150 and the above stacked layers formed on the substrate 110 (for example, the buffer layer BL, the blocking structure 130 and/or the composite layer ML) due to the split. Actually, when the encapsulation layer 150 is formed, the gap G generated due to the split, for example, does not exist between the encapsulation layer 150 and other stacked layers formed on the substrate 110 (for example, the buffer layer BL, the blocking structure 130 and/or the composite layer ML).

Figure 9:
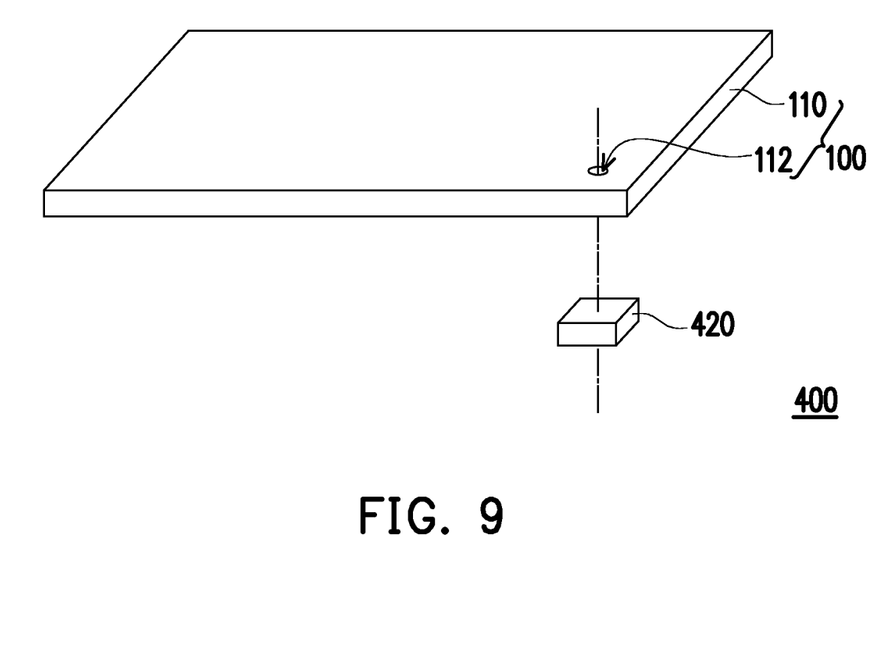
FIG. 9 is a schematic disassembling diagram of partial components of an electronic device according to an embodiment of the disclosure.

FIG. 9 is a schematic disassembling diagram of partial components of an electronic device according to an embodiment of the disclosure. An electronic device 400 may include the display panel 100 and a sensing element 420. The display panel 100 may be specifically implemented by the aforementioned display panel 100, the display panel 200, the display panel 300, or a display panel with a similar structure. The substrate 110 of the display panel 100 may have at least one through hole 112, the display area 114 (not shown in FIG. 9), and the non-display area 116 (not shown in FIG. 9) located between the through hole 112 and the display area 114, where the display area 114 may, for example, surround the through hole 112. Although FIG. 9 does not show the specific design of the display panel 100, the display panel 100 includes the substrate, the light-emitting units, the blocking structure, the encapsulation layer and other components described in the aforementioned embodiments. FIG. 9 only shows the through hole 112 on the substrate 110, and the sensing element 420 may be, for example disposed under the display panel 100 and correspond to the through hole 112. In some embodiments, the through hole 112 helps the sensing element 420 to effectively implement its sensing function, and the function of the sensing element 420 is not reduced or lost due to being located under the display panel 100. In some embodiments, the sensing element 420 may include a photosensitive assembly (for example, a camera assembly), but the disclosure is not limited thereto.

In summary, in the display panel and the electronic device of the embodiments of the disclosure, the through hole may be provided in the display area, and the sensing element may be disposed under the display panel and corresponding to the through hole. In addition, in the aforementioned embodiments, the design of the blocking structure arranged around the through hole may make the inorganic layer in the encapsulation layer denser and less likely to break, or the organic layer in the encapsulation layer close to the light-emitting unit may divide into portions separated from each other on the blocking structure to reduce the chance that moisture intrudes into the light-emitting unit. In other words, the display panel of the embodiments of the disclosure may have ideal quality and extended service life, so that the electronic device having such display panel has good quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A display panel, comprising:
a substrate, having, a display area, and a non-display area disposed adjacent to the display area;
a plurality of light-emitting units, arranged on the display area;
a blocking structure, arranged on the non-display area of the substrate,
wherein the blocking structure is a protruding structure;
a conductive pattern, disposed between the blocking structure and the substrate; and
an encapsulation layer, extending from the display area to the non-display area, and comprising an organic layer and a first inorganic layer, wherein a portion of the organic layer is disposed between the blocking structure and the first inorganic layer.

2. The display panel as claimed in claim 1, wherein in a cross section of the display panel, the portion of the organic layer has a first thickness at a first end of the blocking structure and a second thickness at a second end of the blocking structure, wherein the first end is closer to the display area than the second end, and the first thickness is greater than the second thickness.

3. The display panel as claimed in claim 1, wherein in a cross section of the display panel, the portion of the organic layer has two separated portions.

4. The display panel as claimed in claim 1, wherein the encapsulation layer further comprises a second inorganic layer, the second inorganic layer is disposed under the organic layer, and the first inorganic layer contacts the second inorganic layer on the blocking structure.

5. The display panel as claimed in claim 1, wherein the blocking structure has a first end and a second end relative to the first end in a cross section of the display panel, and the first end and the second end have different angles relative to a surface of the substrate.

6. The display panel as claimed in claim 1, wherein the substrate has a slit, the blocking structure is disposed between the slit and display area, the blocking structure and the slit are separated by a distance in a direction perpendicular to a normal direction of the substrate, the distance is greater than the maximum thickness of the blocking structure in a cross section of the display panel, and a width of the slit is less than a width of the blocking structure.

7. The display panel as claimed in claim 6, wherein a ratio of the distance to a maximum thickness of the blocking structure is greater than 1 and less than or equal to 3.

8. The display panel as claimed in claim 1, wherein the blocking structure has a maximum width and a maximum thickness in a cross section of the display panel, and a ratio of the maximum width to the maximum thickness is greater than or equal to 2.5 and less than or equal to 15.

9. The display panel as claimed in claim 1, wherein a top surface of the blocking structure has a recess.

10. The display panel as claimed in claim 1, wherein the blocking structure has a first portion, a second portion, and a third portion between the first portion and the second portion, and in a cross section of the display panel, a maximum thickness of the first portion is different from a maximum thickness of the second portion.

11. The display panel as claimed in claim 1, wherein the substrate has a slit, and in the cross section of the display panel, a ratio of a maximum thickness of the blocking structure to a maximum depth of the slit is greater than 1 and less than or equal to 3.

12. The display panel as claimed in claim 1, wherein the substrate has a plurality of slits, and at least two of the plurality of slits have different widths.

13. An electronic device, comprising:
a display panel, comprising:
a substrate, having a display area, and a non-display area disposed adjacent to the display area;
a plurality of light-emitting units, arranged on the display area;
a blocking structure, arranged on the non-display area of the substrate,
wherein the blocking structure is a protruding structure;
a conductive pattern, disposed between the blocking structure and the substrate; and
an encapsulation layer, extending from the display area to the non-display area, and comprising an organic layer and a first inorganic layer, wherein a portion of the organic layer is disposed between the blocking structure and the first inorganic layer; and
a sensing element, disposed under the display panel.

14. The electronic device as claimed in claim 13, wherein in a cross section of the display panel, the portion of the organic layer has a first thickness at a first end of the blocking structure and a second thickness at a second end of the blocking structure, wherein the first end is closer to the display area than the second end, and the first thickness is greater than the second thickness.

15. The electronic device as claimed in claim 13, wherein in a cross section of the display panel, the portion of the organic layer has two separated portions.

16. The electronic device as claimed in claim 13, wherein the encapsulation layer further comprises a second inorganic layer, the second inorganic layer is disposed under the organic layer, and the first inorganic layer contacts the second inorganic layer on the blocking structure.

17. The electronic device as claimed in claim 13, wherein the substrate has a slit, the blocking structure is disposed between the slit and display area, the blocking structure and the slit are separated by a distance in a direction perpendicular to a normal direction of the substrate, the distance is greater than a maximum thickness of the blocking structure in a cross section of the display panel, and a width of the slit is less than a width of the blocking structure.

18. The electronic device as claimed in claim 17, wherein a ratio of the distance to the maximum thickness of the blocking structure is greater than 1 and less than or equal to 3.

19. The electronic device as claimed in claim 13, wherein the blocking structure has a first portion, a second portion, and a third portion between the first portion and the second portion, and in a cross section of the display panel, the maximum thickness of the first portion is different from the maximum thickness of the second portion.

20. The electronic device as claimed in claim 13, wherein the substrate has a slit, and in the cross section of the display panel, a ratio of a maximum thickness of the blocking structure to a maximum depth of the slit is greater than 1 and less than or equal to 3.

* * * * *